United States Patent
DiFoggio

(10) Patent No.: US 7,817,285 B2
(45) Date of Patent: Oct. 19, 2010

(54) DOWNHOLE USES OF PRESSURE-TUNED SEMICONDUCTOR LIGHT SOURCES

(75) Inventor: Rocco DiFoggio, Houston, TX (US)

(73) Assignee: Baker Hughes Incorporated, Houston, TX (US)

( * ) Notice: Subject to any disclaimer, the term of this patent is extended or adjusted under 35 U.S.C. 154(b) by 279 days.

(21) Appl. No.: 11/870,503

(22) Filed: Oct. 11, 2007

(65) Prior Publication Data

US 2009/0097093 A1    Apr. 16, 2009

(51) Int. Cl.
*G01B 9/02* (2006.01)

(52) U.S. Cl. ..................................... 356/484

(58) Field of Classification Search ............... 356/32, 356/34, 35.5, 436, 440, 484; 250/269.1
See application file for complete search history.

(56) References Cited

U.S. PATENT DOCUMENTS

| 4,664,196 | A | * | 5/1987 | Manke ................ 166/378 |
| 6,016,702 | A | * | 1/2000 | Maron ................ 73/705 |
| 6,486,958 | B1 | * | 11/2002 | Szafraniec et al. .......... 356/484 |
| 6,693,848 | B1 | | 2/2004 | Ambs et al. |
| 7,196,786 | B2 | | 3/2007 | DiFoggio |
| 2005/0007583 | A1 | | 1/2005 | DiFoggio |
| 2005/0269499 | A1 | * | 12/2005 | Jones et al. .......... 250/269.1 |
| 2007/0159625 | A1 | | 7/2007 | DiFoggio |

OTHER PUBLICATIONS

Wippich et al., "Tunable Lasers and Fiber-Bragg-Grating Sensors." The industrial Physicist, p. 24-27 Jun./Jul. 2003), p. 24-25.
Chapin, "Gravity instruments: Past, present, future", The Leading Edge, 100-112, Jan. 1998. pp. 102-104.
International Search Report for International Application No. PCT/US 08/79493. Mailed May 27, 2009.
Written Opinion of the International Searching Authority for International Application No. PCT/US 08/79493. Mailed May 27, 2009.
F. Dybala, et al. "Tunable laser in 1575 nm-1255 nm range achieved by pressure tuning combined with grating tuning". phys.stat. sol. (b) 244, No. 1, 219-223 (2007)/DOI 10.1002/pssb.200672578.
Pawel Adamiec, et al. "Pressure tuning of high-power laser diodes". Proceedings of SPIE. vol. 4973 (2003). pp. 158-165.
P. Adamiec, et al. "Pressure-tuned InGaAsSb/AlGaAsSb diode laser with 700 nm tuning range". Applied Physics Letters. vol. 85, No. 19. Nov. 8, 2004. pp. 4292-4294.
Benjamin Welber, et al. "Dependence of the direct energy gap of GaAs on hydrostatic pressure". Physical Review B. vol. 12, No. 12. Dec. 15, 1975. pp. 5729-5738.
P. Stepinski, et al. "Pressure Tuned Laser Diode as a Light Source for Characterization of Optical Transmission Lines". ICTON 2000. pp. 103-106.
T. Suski, et al. "A pressure-tuned blue-violet InGaN/GaN laser diode grown on bulk GaN crystal". Applied Physical Letters. vol. 84, No. 8. Feb. 23, 2004. pp. 1236-1238.

(Continued)

*Primary Examiner*—Samuel A Turner
(74) *Attorney, Agent, or Firm*—Cantor Colburn LLP

(57) ABSTRACT

An instrument for use in a borehole, the instrument including a pressure tuned light source disposed in a housing adapted for insertion into the borehole.

23 Claims, 7 Drawing Sheets

OTHER PUBLICATIONS

F. Dybala, et al. "Wavelength Tuning of InGaAs/GaAs Laser Diodes by the Application of High Hydrostatic Pressure". ICTON 2002 pp. 93-97.

W. Trzeciakowski, et al. "Pressure and temperature tuning of laser diodes". phys. stat. sol. (b) 244, No. 1, 179-186 (2007)/DOI 10.1002/pssb/200672508.

S.J. Sweeney, et al. "Improved temperature dependence of 1.3 um AlGaInAs-based MQW semiconductor diode lasers revealed by hydrostatic pressure". Electronics Letters. Oct. 29, 1998. vol. 34, No. 22. pp. 2130-2132.

V.B. Anzin, et al. "Application of Pressure-Tuned Diode Lasers to High-Resolution Spectroscopy". Appl. Phys. 22, 241-243 (1980).

* cited by examiner

US 7,817,285 B2

DOWNHOLE USES OF PRESSURE-TUNED SEMICONDUCTOR LIGHT SOURCES

BACKGROUND OF THE INVENTION

1. Field of the Invention

The invention disclosed herein relates to measuring force, gravity, pressure and properties of materials in a borehole.

2. Description of the Related Art

In exploration for hydrocarbons, it is important to make accurate measurements of properties of geologic formations. In particular, it is important determine the various properties with a high degree of accuracy so that drilling resources are used efficiently.

Generally, oil and gas are accessed by drilling a borehole into the subsurface of the earth. The borehole also provides access for taking measurements of the geologic formations.

Well logging is a technique used to take measurements of the geologic formations from the borehole. In one embodiment, a logging instrument is lowered on the end of a wireline into the borehole. The logging instrument sends data via the wireline to the surface for recording. Output from the logging instrument comes in various forms and may be referred to as a "log." Many types of measurements are made to obtain information about the geologic formations. One type of measurement involves determining gravitational force or gravity.

Measurements of gravity can be used to determine information related to the mass of a surrounding formation. For example, measurements of gravity can be used to measure oil depletion in the surrounding formation as water replaces the oil. When water replaces oil in the formation, the mass of the formation and, therefore, a gravitational force exerted by the formation will increase because water is denser than oil.

It is also important to measure parameters in the borehole that may affect drilling operations. One important measurement is pressure within the borehole drilling mud. For safety and environmental concerns, the pressure of drilling mud is maintained at a pressure higher than any pore fluid pressure of any open formation traversed by the borehole. Generally, the density of the drilling mud is important to know in order to maintain the desired pressure of the drilling mud. The density can be determined by measuring the pressure of the borehole fluid at incremental depths to determine the pressure gradient and, therefore, the mud density over each interval.

Accurate measurements of formation characteristics and borehole parameters require accurate measurements of force, gravity and pressure.

Another type of measurement involves performing optical spectroscopy on a material in the borehole such as a formation fluid. Certain types of optical spectroscopy require light of various wavelengths. Due to spatial constraints in the borehole, it is advantageous to have a single light source provide the light.

Therefore, what are needed are techniques for making accurate measurements of force, gravity, pressure and material properties in a borehole.

BRIEF SUMMARY OF THE INVENTION

Disclosed is an embodiment of an instrument for use in a borehole, the instrument including a pressure tuned light source disposed in a housing adapted for insertion into the borehole.

Also disclosed is one example of a method for performing a measurement in a borehole, the method including applying hydrostatic pressure to a pressure tuned light source disposed into the borehole; and detecting an optical signal from the applying wherein the signal includes information related to the measurement.

Further disclosed is an embodiment of an instrument for use in a borehole, the instrument including means for emitting light with a wavelength related to a hydrostatic pressure wherein the means is disposed into the borehole.

BRIEF DESCRIPTION OF THE DRAWINGS

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings, wherein like elements are numbered alike, in which:

DETAILED DESCRIPTION OF THE INVENTION

The teachings provide techniques for accurately measuring at least one of force, gravity, pressure, and properties of materials downhole. These measurements are performed using a pressure tuned light source as a sensor for measuring at least one of force, gravity and pressure with high accuracy. The pressure tuned light source emits light at a wavelength and corresponding frequency related to a hydrostatic pressure exerted upon the pressure tuned light source. By measuring the wavelength or corresponding frequency of the light, the pressure exerted upon the pressure tuned light source can be determined. With the pressure tuned light source, a change in pressure of 0.02 MPa (3 psi) can produce a change of hundreds of MHz in the frequency of light emitted. For comparison to prior art, the change in frequency of a typical downhole quartz resonator pressure gauge is only about seven Hz for a three psi change. Such large changes in the frequency of the emitted light resulting from small changes in pressure result in a very high resolution sensor for measuring pressure. The pressure tuned light source can also be used to measure force such as gravitational force. When the pressure tuned light source is used to measure force, the force is converted by an apparatus such as a piston to a pressure exerted upon the pressure tuned light source.

In another application, the pressure tuned light source can be used for optical spectroscopy of fluids or minerals in the borehole. Some optical spectroscopy measurements require light with various wavelengths. The wavelength of the light emitted from the pressure tuned light source can be selected by applying an appropriate hydrostatic pressure. Some types of optical spectroscopy that can use the pressure tuned light source include absorption, attenuated reflection, and Raman spectroscopy.

For convenience, certain definitions are provided. The term "pressure tuned light source" relates to a semiconductor that emits light with a wavelength and corresponding frequency in relation to an amount of pressure exerted upon the semiconductor. Exemplary embodiments of the pressure tuned light source include a laser diode and a light emitting diode (LED). The term "pressure chamber" relates to a device having a volume into which the pressure tuned light source may be placed. The pressure chamber also includes a way for light emitted from the pressure tuned laser to be transmitted outside of the chamber. The pressure chamber is used to exert hydrostatic pressure on the pressure tuned light source. The term "housing" relates to a structure of a logging instrument. The housing may used to at least one of contain and support the pressure tuned light source. The term "Group III-V semiconductors" relate to semiconductors listed in the III and V columns of the periodic table of elements.

Figure 1:
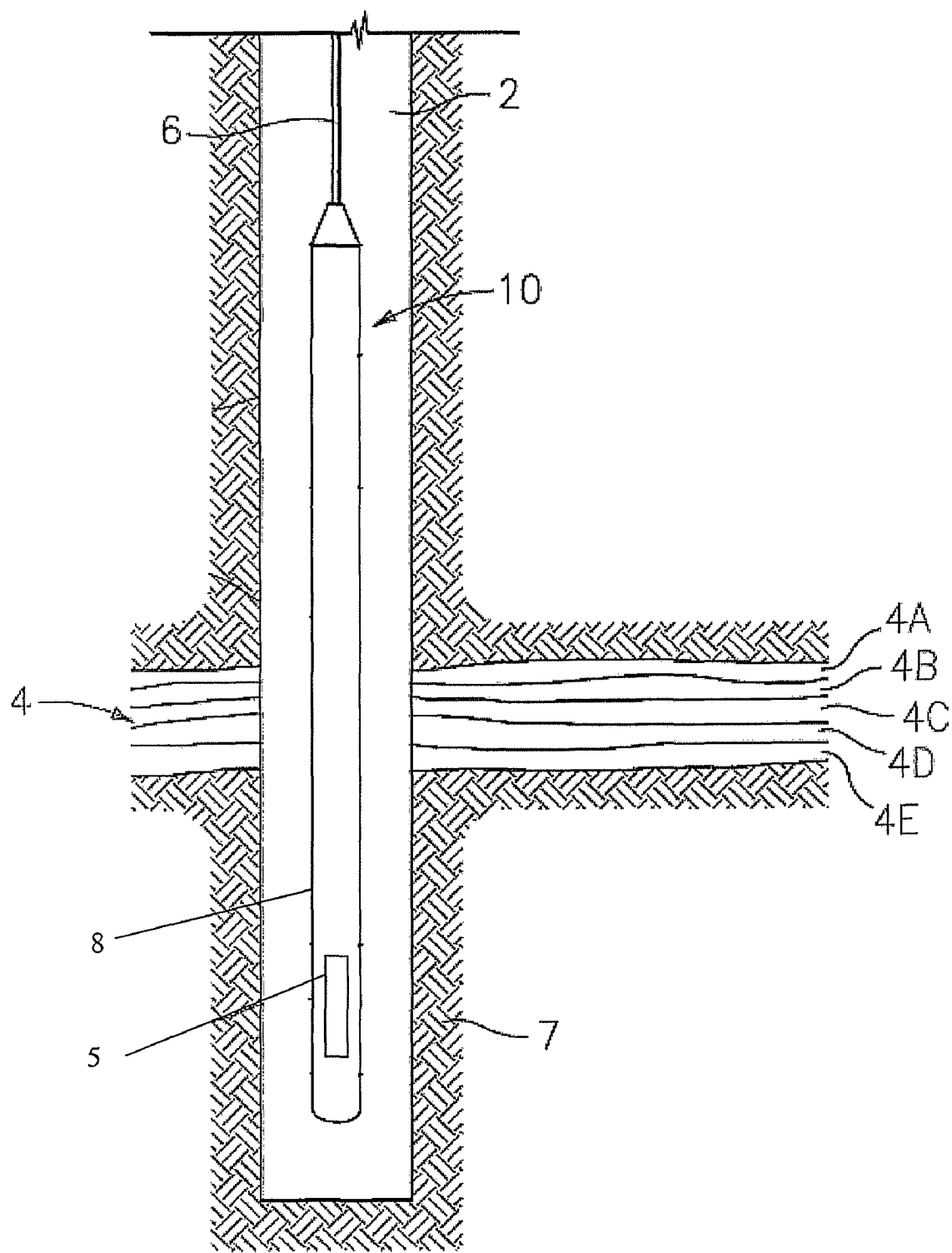
FIG. 1 illustrates an exemplary embodiment of a logging instrument in a borehole penetrating the earth.

Referring to FIG. 1, a well logging instrument 10 is shown disposed in a borehole 2. The logging instrument 10 may be used for measuring at least one of characteristics of a formation and borehole parameters. The logging instrument 10 includes an instrument housing 8 adapted for use in the borehole 2. The borehole 2 is drilled through earth 7 and penetrates formations 4, which include various formation layers 4A-4E. The logging instrument 10 is typically lowered into and withdrawn from the borehole 2 by use of an armored electrical cable 6 or similar conveyance as is known in the art. A pressure tuned light source 5 (also referred to as "light source 5") is shown disposed in the housing 8. Generally, the light source 5 may be coupled to a device for at least one of processing and recording a measurement performed using the light source 5. The device may be located at least one of in the logging instrument 10 and at the surface of the earth 7.

In some embodiments, the borehole 2 includes materials such as would be found in oil exploration, including a mixture of liquids such as water, drilling fluid, mud, oil and formation fluids that are indigenous to the various formations. One skilled in the art will recognize that the various features as may be encountered in a subsurface environment may be referred to as "formations." Accordingly, it should be considered that while the term "formation" generally refers to geologic formations of interest, that the term "formations," as used herein, may, in some instances, include any geologic points of interest (such as a survey area).

For the purposes of this discussion, it is assumed that the borehole 2 is vertical and that the formations 4 are horizontal. The teachings herein, however, can be applied equally well in deviated or horizontal wells or with the formation layers 4A-4E at any arbitrary angle. The teachings are equally suited for use in logging while drilling (LWD) applications and in open-borehole and cased-borehole wireline applications. In LWD applications, the logging instrument 10 may be disposed in a drilling collar. When used in LWD applications, drilling may be halted temporarily to prevent vibrations while the light source 5 is used to perform a measurement.

Figure 2:
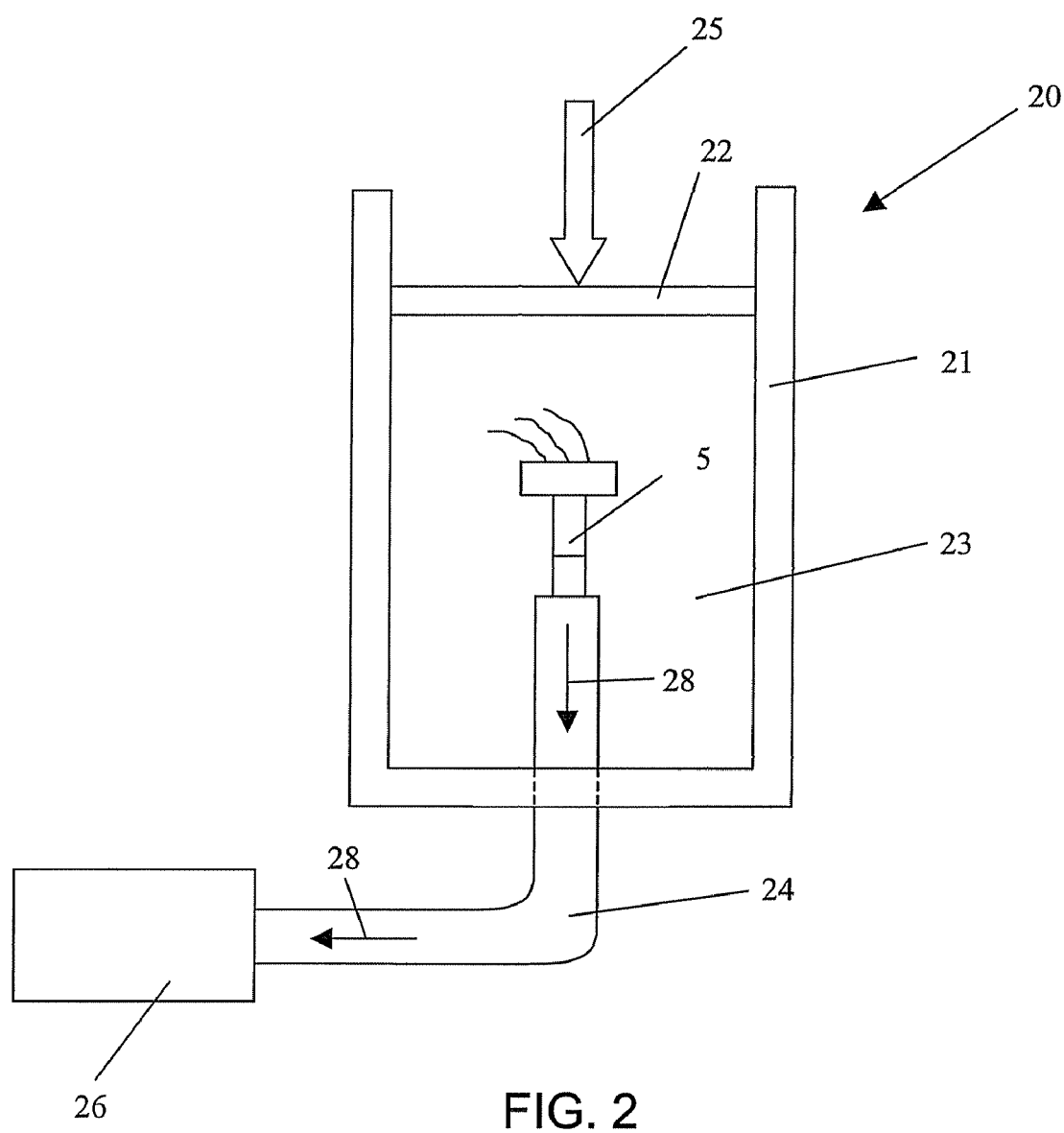
FIG. 2 illustrates an exemplary embodiment of a pressure tuned light source disposed in a pressure chamber.

FIG. 2 illustrates an exemplary embodiment of a pressure tuned light source 5 and associated apparatus. Referring to FIG. 2, the pressure tuned light source 5 is disposed in a pressure chamber 20. In the embodiment of FIG. 2, the pressure chamber 20 includes a body 21, a piston 22, a fluid 23, and an optical fiber 24. The light source 5 is surrounded by the fluid 23 within the body 21. A force 25 acting upon the piston 22 is transferred by the piston 22 to the fluid 23. The force 25 may result from a mechanical force such as that exerted by a linkage or by pressure exerted by a fluid, external to the pressure chamber 20, acting upon an area of the piston 22. As the force 25 increases, the hydrostatic pressure of the fluid 23 increases. Alternatively, as the force 25 decreases, the hydrostatic pressure of the fluid 23 decreases. The hydrostatic pressure of the fluid 23 is exerted upon the light source 5.

Referring to FIG. 2, the optical fiber 24 transfers light emitted by the light source 5 to the exterior of the pressure chamber 20. The light emitted by the light source 5 is depicted by arrows 28 in FIG. 2. Once the emitted light is outside of the pressure chamber 20, the wavelength or corresponding frequency of the light may be measured. The wavelength or frequency can be correlated to the hydrostatic pressure of the fluid 23. Further, the hydrostatic pressure of the fluid 23 can be correlated to the force 25. Also, the area of the piston 22 can be reduced to the extent desired so as to provide high pressure without having to apply a high force to the piston 22 analogous to a hydraulic jack.

Alternatively, the force 25 may be selected and exerted upon the piston 22 to provide light emitted from the light source 5 with a desired frequency. The light with the desired frequency may be used for the optical spectroscopy discussed above.

Materials and components of the pressure chamber 20 are selected to be operable at operating pressures exerted upon the pressure tuned light source 5. For example, the fluid 23 is selected to be transmissive to light at the operating pressures and to be chemically inert and electrically non-conductive even at borehole temperatures. One exemplary embodiment of the fluid 23 is a perfluoro-alkane fluid. Another exemplary embodiment of the fluid 23 is silicone oil or other clear hydraulic fluid. In one embodiment, the pressure chamber 20 is made from maraging (substantially "carbon free") steel.

A laser diode may be selected as the pressure tuned light source 5. An increase in hydrostatic pressure acting upon the laser diode causes compression and reduces inter-atomic spacing in layers of the laser diode. In turn, the reduction of inter-atomic spacing causes an increase in the bandgap of semi-conductor materials in the laser diode. The effect is analogous to the increase in inter-atomic spacing caused by thermal expansion, which reduces the bandgap and causes a "red" shift if the laser diode. In most Group III-V semiconductors, the change in the electronic band structure causes an increase in the forbidden gap at a rate of about ten meV per kbar. Therefore, the increase in hydrostatic pressure results in shifting the wavelength of light emitted from the laser diode to shorter wavelengths (and associated higher frequency and higher energy), which is referred to as a "blue" shift.

Referring to FIG. 2, a light detector 26 measures the frequency of the light emitted from the pressure tuned light source 5. It is difficult to measure the frequency of the emitted light directly. Present day electronic circuitry is not fast enough to count optical frequencies directly. One technique for measuring the frequency involves creating interference between the light emitted from the light source 5 and a light of a known frequency emitted from a reference light source. The interference creates an interference pattern with a "beat frequency." The beat frequency is related to a difference in frequencies between the light emitted from the light source 5 and the light emitted from the reference light source. Because the beat frequency is related to the difference in frequencies, the beat frequency is much lower than the optical frequencies. Thus, the beat frequency can be measured more easily (by existing electronic counters) than the frequency of one source of light directly. Therefore, by knowing the beat frequency and the reference frequency, the frequency of the light emitted from the light source 5 can be determined. In one embodiment, the light detector 26 includes electronics for measuring the beat frequency.

To compensate for temperature, two laser diodes, in thermal communication with each other (at substantially the same temperature), can be used. In this embodiment, one laser diode is exposed to both temperature and pressure while the other laser diode is exposed only to temperature. The laser diode that is exposed only to temperature can be used as the reference laser. To account for slight variations in the temperature behavior of the two laser diodes, the beat frequency between the two laser diodes can be recorded as a function of temperature with no pressure applied. Then, when pressure is applied to one laser diode, the change of the beat frequency relative to the temperature-only beat frequency becomes a measure of the effect of pressure alone.

Figure 3:
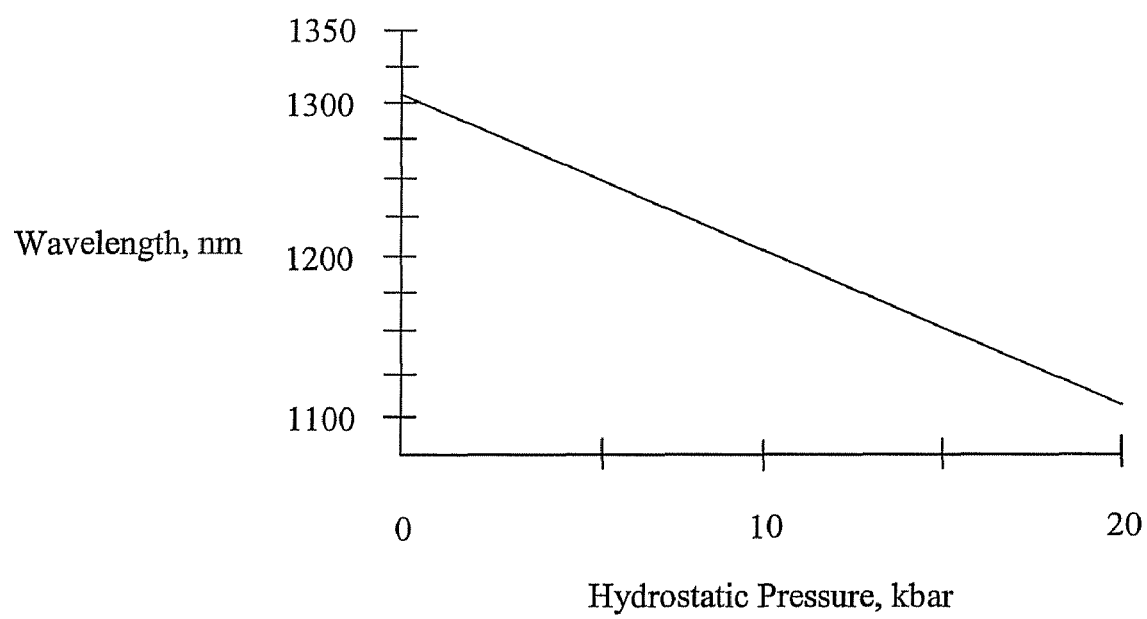
FIG. 3 presents a graph of wavelength of light emitted from one example of a laser diode versus hydrostatic pressure.

FIG. 3 presents a graph of wavelength of light emitted from one example of a laser diode versus hydrostatic pressure. The laser diode represented by the graph of FIG. 3 emits light at a wavelength of about 1310 nanometers (nm) at about atmospheric pressure. A decrease in the wavelength of the light is about linear with a decrease of approximately ten nm per kbar increase in hydrostatic pressure. The laser diode represented in FIG. 3 is based upon InGaAsP/InP.

A range of wavelengths of light emitted from the pressure tuned light source 5 can be as high as 700 nm for embodiments using an InGaAsSb laser diode. Other embodiments of the pressure tuned light source 5 include laser diodes based on at least one of AlGaInAs, InGaAsP/InP, InGaP/InGaAlP, GaAs/AlGaAs, and InGaN/GaN. The hydrostatic pressure applied to the light source 5 can vary from zero kbar to over twenty kbar to achieve the range of wavelengths.

Figure 4:
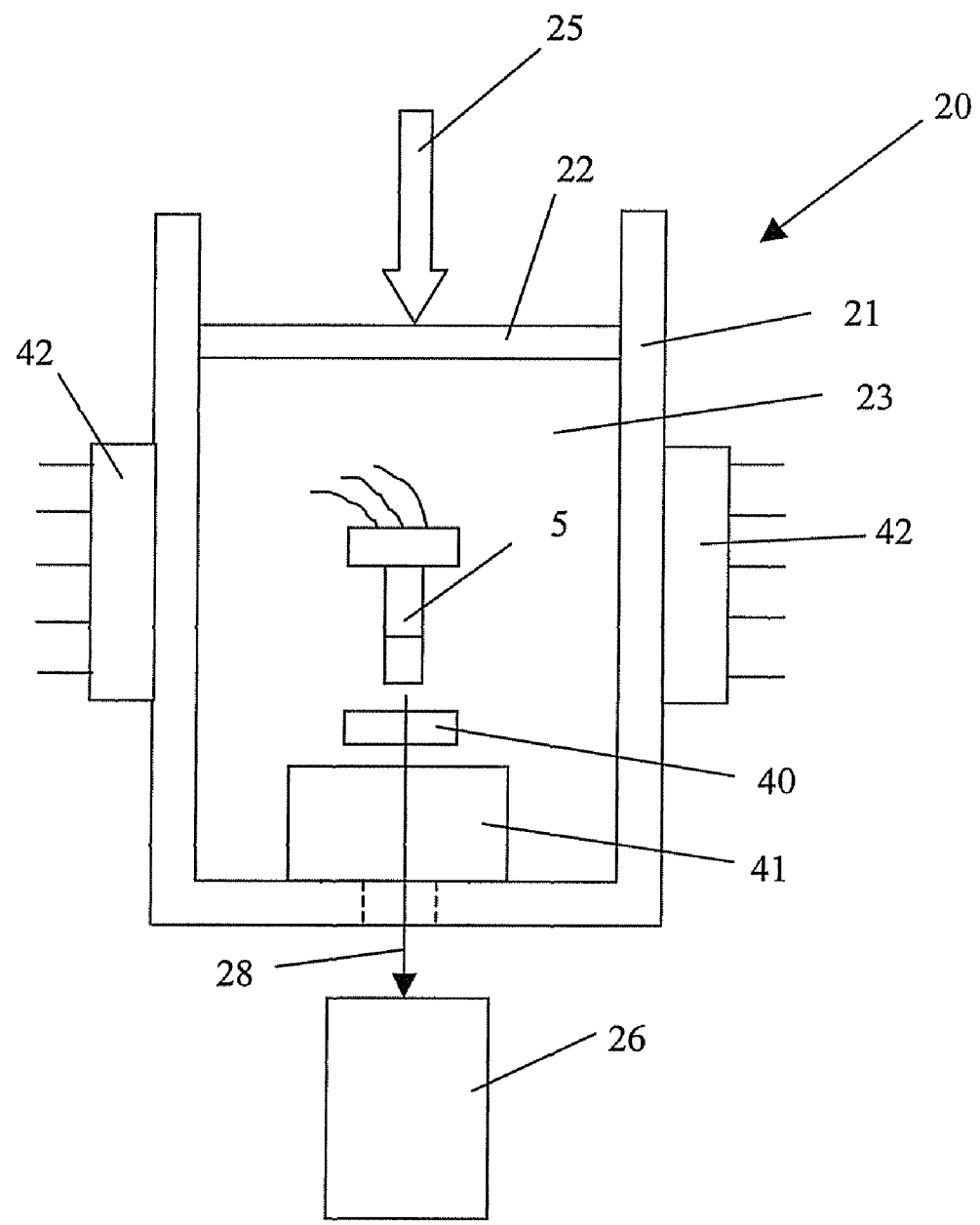
FIG. 4 illustrates one example of the pressure tuned light source disposed in another embodiment of the pressure chamber.

FIG. 4 illustrates one example of the pressure tuned light source 5 disposed in another embodiment of the pressure chamber 20. In the embodiment of FIG. 4, light emitted from the light source 5 travels through a lens 40 and a window 41 to exit the pressure chamber 20. The lens 40 collimates light from the light source 5. In one embodiment, the window 41 is made of sapphire.

Generally, the light source 5 emits heat when energized. As the temperature of the light source 5 increases, the wavelength of the light emitted also increases. In order to stabilize the temperature of the light source 5 and, therefore, stabilize the wavelength of the emitted light, a heat transfer unit 42 may be coupled to the pressure chamber 20 as shown in FIG. 4. In the embodiment of FIG. 4, the heat transfer unit 42 dissipates the heat from the pressure chamber 20 into surrounding air.

Another technique for stabilizing the temperature of the light source 5 is to use pulsed operation. With pulsed operation, the light source 5 is energized for a duration corresponding with a pulse of light. Limiting the time the light source 5 is energized limits the heat generated. In contrast, with continuous wave operation, the light source 5 is continuously energized while continuously emitting light.

Figure 5:
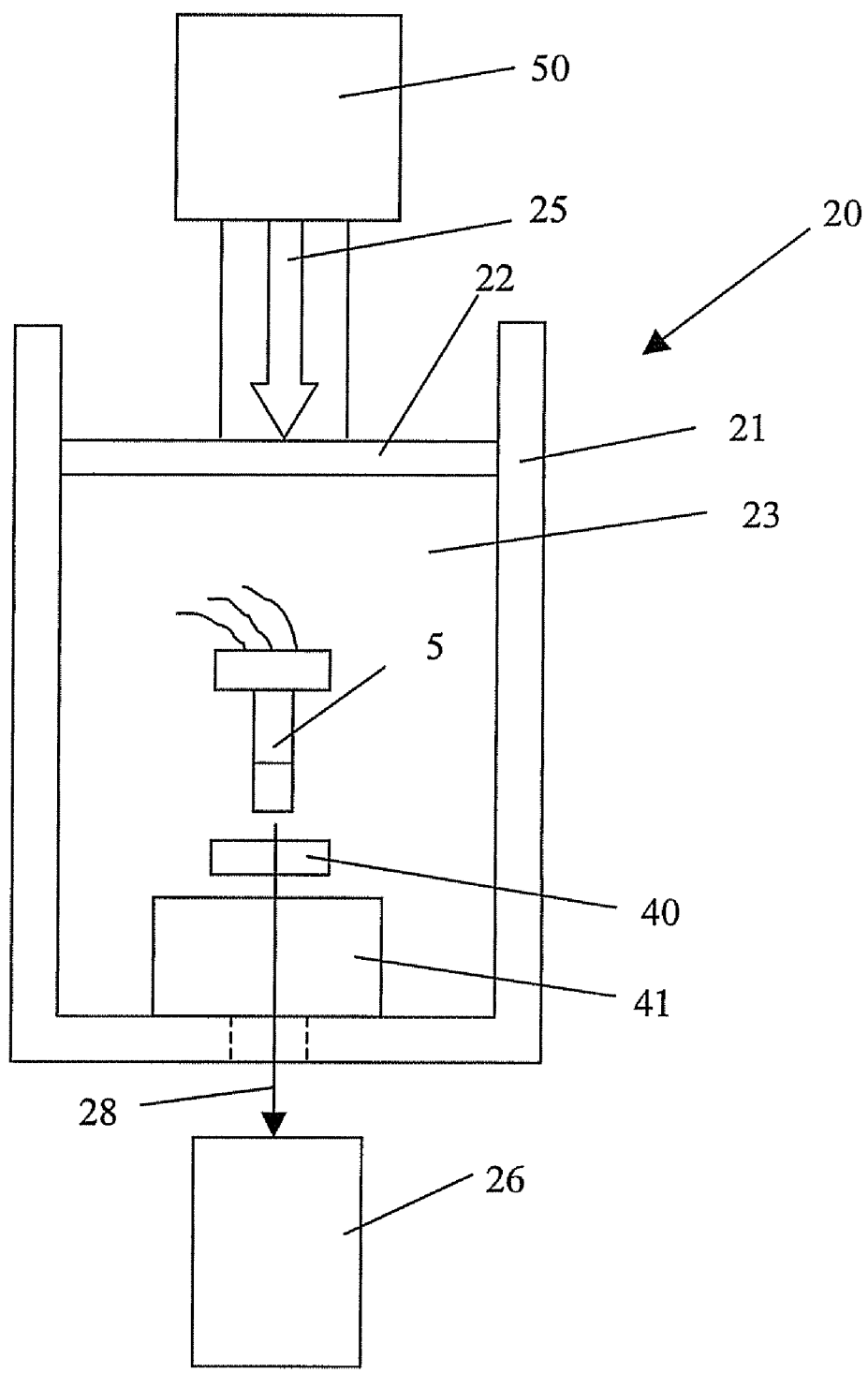
FIG. 5 illustrates one embodiment of the pressure tuned light source and apparatus used to measure gravity.

The pressure tuned light source 5 may be used to measure gravitational force or gravity. One embodiment of the pressure tuned light source 5 and apparatus used to measure gravity is illustrated in FIG. 5. Referring to FIG. 5, a proof mass 50 is coupled to the piston 22. In this embodiment, the force 25 is derived from the gravitational force acting upon the proof mass 50. As discussed above, the hydrostatic pressure of the fluid 23 and, in turn, the force 25 can be correlated to the frequency of the light emitted from the pressure tuned light source 5. Therefore, a value of gravity can be determined at a location by knowing the mass of the proof mass 50 and determining the force 25 at the location. Alternatively, the proof mass 50 can be coupled directly to the light source 5. Although the weight of the proof mass 50 is not a hydrostatic loading of the light source 5, the weight will cause changes to the lattice structure of the light source 5. The changes to the lattice structure will, in turn, cause the wavelength of light emitted from the light source 5 to shift.

Figure 6:
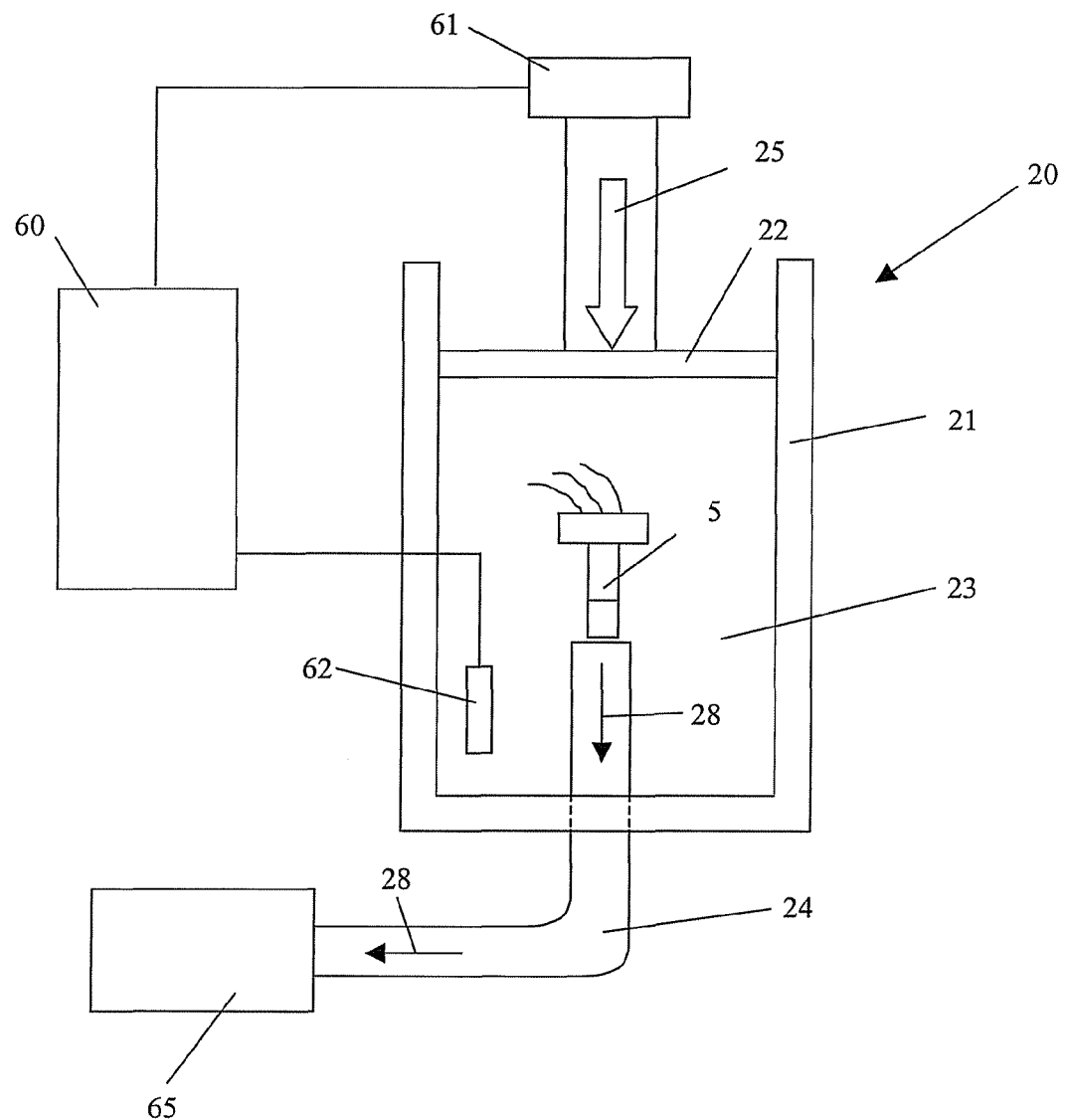
FIG. 6 illustrates an embodiment of the pressure tuned light source 5 and apparatus for providing light at certain frequencies for optical spectroscopy.

Another embodiment of the pressure tuned light source 5 and apparatus may be used to provide light at certain frequencies for optical spectroscopy. FIG. 6 illustrates an embodiment of the pressure tuned light source 5 and apparatus for providing light at certain frequencies for optical spectroscopy. The embodiment of FIG. 6 includes the pressure tuned light source 5 disposed within the pressure chamber 20. Light emitted from the light source 5 is provided to an optical spectrometer 65 as shown in FIG. 6. The embodiment of FIG. 6 also includes a control system 60 coupled to a force generator 61 and a pressure transducer 62. The control system 60 receives input related to a desired frequency of light to be provided by the pressure tuned light source 5. In turn, the control system 60 provides output related to the force 25 that the force generator 61 will apply to the piston 22. The force 25 is the force necessary to result in the hydrostatic pressure of the fluid 23 that is correlated to the desired frequency of light emitted from the light source 5. The pressure transducer 62 measures the hydrostatic pressure of the fluid 23. The control system 60 receives input from the pressure transducer 62 and uses the input for feedback control of the force generator 61. One example of the pressure transducer 62 is an InSb pressure transducer. Alternatively, one or more fiber Bragg grating (FBG) optical filters can be used as a wavelength standard. In embodiments using the FBG filter, the hydrostatic pressure can be adjusted until the light emitted by the light source 5 matches that of the desired FBG filter as evidenced by maximum reflection intensity from that FBG filter.

In another embodiment of the pressure tuned light source 5 and apparatus for providing light at a desired frequency, the light detector 26 can be used to measure the frequency of the light emitted from the light source 5. In this embodiment, the control system 60 receives input from the light detector 26 for feedback control of the force generator 61. When the desired frequency of light is obtained, the light can be directed to the optical spectrometer 65.

Each embodiment of the pressure tuned light source 5 emits light with a certain range of wavelengths corresponding to a range of hydrostatic pressure exerted upon the light source 5. For an application requiring a broader range of wavelengths, a plurality of pressure tuned light sources 5 may be used in the logging instrument 10. Each of the pressure tuned light sources 5 may be selected to have a range of wavelengths different from the ranges of the other light sources 5 in the plurality. In addition, the ranges may be selected to provide a broad continuum of wavelengths necessary for the application.

Generally, the well logging instrument 10 includes adaptations as may be necessary to provide for operation during drilling or after a drilling process has been completed.

Figure 7:
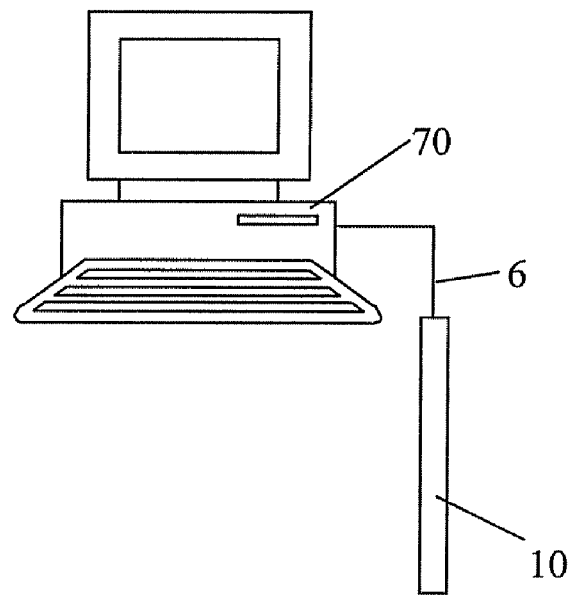
FIG. 7 illustrates an exemplary embodiment of the logging instrument connected to a computer.

Referring to FIG. 7, an apparatus for implementing the teachings herein is depicted. In FIG. 7, the apparatus includes a computer 70 coupled to the well logging instrument 10. Typically, the computer 70 includes components as necessary to provide for the real time processing of data from the well logging instrument 10. Exemplary components include, without limitation, at least one processor, storage, memory, input devices, output devices and the like. As these components are known to those skilled in the art, these are not depicted in any detail herein.

Generally, some of the teachings herein are reduced to an algorithm that is stored on machine-readable media. The algorithm is implemented by the computer 70 and provides operators with desired output. The output is typically generated on a real-time basis.

The logging instrument 10 may be used to provide real-time measurements of one of force, gravity, pressure, and spectroscopy parameters. As used herein, generation of data in "real-time" is taken to mean generation of data at a rate that is useful or adequate for making decisions during or concurrent with processes such as production, experimentation, verification, and other types of surveys or uses as may be opted for by a user or operator. As a non-limiting example, real-time measurements and calculations may provide users with information necessary to make desired adjustments during the drilling process. In one embodiment, adjustments are enabled on a continuous basis (at the rate of drilling), while in another embodiment, adjustments may require periodic cessation of drilling for assessment of data. Accordingly, it should be recognized that "real-time" is to be taken in context, and does not necessarily indicate the instantaneous determination of data, or make any other suggestions about the temporal frequency of data collection and determination.

A high degree of quality control over the data may be realized during implementation of the teachings herein. For example, quality control may be achieved through known techniques of iterative processing and data comparison. Accordingly, it is contemplated that additional correction factors and other aspects for real-time processing may be used. Advantageously, the user may apply a desired quality control tolerance to the data, and thus draw a balance between rapidity of determination of the data and a degree of quality in the data.

Figure 8:
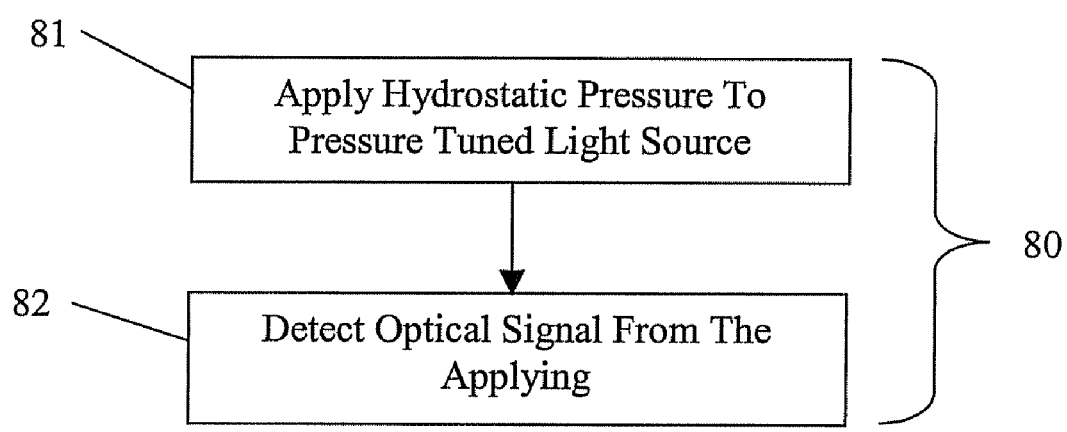
FIG. 8 presents one example of a method for performing a measurement in a borehole.

FIG. 8 presents one example of a method 80 for performing a measurement in the borehole 2. The method 80 calls for applying 81 hydrostatic pressure to the pressure tuned light source 5 disposed into the borehole 2. Further, the method 80 calls for detecting 82 an optical signal from the applying wherein the signal comprises information related to the measurement.

In certain embodiments, a string of two or more logging instruments 10 may be used where each logging instrument 10 includes at least one pressure tuned light source 5. In these embodiments, the responses from the pressure tuned light sources 5 may be used separately or combined to produce a composite response.

In support of the teachings herein, various analysis components may be used, including digital and/or analog systems. For example, the digital and/or analog systems may be used for the light detector 26, the optical spectrometer 65, the control system 60, the force generator 61, and the pressure sensor 62. The system may have components such as a processor, storage media, memory, input, output, communications link (wired, wireless, pulsed mud, optical or other), user interfaces, software programs, signal processors (digital or analog) and other such components (such as resistors, capacitors, inductors and others) to provide for operation and analyses of the apparatus and methods disclosed herein in any of several manners. It is considered that these teachings may be, but need not be, implemented in conjunction with a set of computer executable instructions stored on a computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

Further, various other components may be included and called upon for providing for aspects of the teachings herein. For example, a power supply (e.g., at least one of a generator, a remote supply and a battery), cooling unit, heating unit, motive force (such as a translational force, propulsional force or a rotational force), sensor, transmitter, receiver, transceiver, controller, optical unit, optical lens, optical penetration, optical connection, electrical unit, electromechanical unit, electrical penetration, electrical connection, pressure seal, sample pump, or sample line may be included in support of the various aspects discussed herein or in support of other functions beyond this disclosure.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood that various changes may be made and equivalents may be substituted for elements thereof without departing from the scope of the invention. In addition, many modifications will be appreciated to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for performing a measurement of at least one of a force, gravity and pressure in a borehole penetrating the earth, the apparatus comprising:
   a pressure tuned light source configured for insertion into the borehole;
   wherein light from the pressure tuned light source is used to perform the measurement.

2. The apparatus as in claim 1, wherein the apparatus is configured for performing optical spectroscopy.

3. The apparatus as in claim 1, further comprising a light detector configured to detect light emitted by the pressure tuned light source.

4. The apparatus as in claim 3, wherein the light detector measures a frequency of light emitted by the pressure tuned light source by creating an interference pattern between the light and light of a known frequency.

5. The apparatus as in claim 1, wherein the light source comprises one of a laser diode and a light emitting diode (LED).

6. The apparatus as in claim 5, wherein the laser diode is based upon at least one of InGaAsSb, AlGaInAs, InGaAsP/InP, InGaP/InGaAlP, GaAs/AlGaAs, and InGaN/GaN.

7. The apparatus as in claim 1, wherein the light source emits light comprising wavelengths over a range of about 700 nanometers.

8. The apparatus as in claim 1, wherein the pressure tuned light source comprises an operational range of between about zero kbar to about twenty kbar.

9. The apparatus as in claim 1, further comprising a body configured to contain the pressure tuned light source immersed in a fluid and a piston configured to exert a force upon the fluid to exert a hydrostatic pressure upon the pressure tuned light source wherein the pressure tuned light source, the body, the piston and the fluid are disposed in a logging instrument configured to be conveyed through the borehole.

10. The apparatus as in claim 1, further comprising one of perfluoro-alkane fluid and silicone oil for exerting a hydrostatic force upon the pressure tuned light source.

11. The apparatus as in claim 1, further comprising at least one of an optical fiber in optical communication with the pressure tuned light source, a collimating lens configured to collimate light emitted from the pressure tuned light source, and a window in optical communication with the pressure tuned light source and disposed at a pressure chamber containing the pressure tuned light source.

12. The apparatus as in claim 1, further comprising a control system, a force generator configured to exert a hydrostatic pressure upon the pressure tuned light source, and a pressure transducer configured to measure the hydrostatic pressure wherein the control system is configured to receive input from the pressure transducer and provide output to the force generator to control the hydrostatic pressure.

13. The apparatus as in claim 1, further comprising an optical spectrometer configured to receive light emitted by the pressure tuned light source for performing optical spectroscopy.

14. The apparatus as in claim 1, further comprising a proof mass in communication with the pressure tuned light source wherein the pressure tuned light source emits light at a frequency related to a gravitational force acting upon the proof mass to measure gravity.

15. The apparatus as in claim 1, further comprising a heat transfer unit coupled to a pressure chamber containing the pressure tuned light source and configured to dissipate heat from the pressure chamber.

16. A method for performing a measurement of at least one of a force, gravity and pressure in a borehole, the method comprising:
   exposing a pressure tuned light source disposed into the borehole to a hydrostatic pressure; and
   detecting light from the pressure tuned light source wherein the light comprises information related to the measurement.

17. The method as in claim 16, wherein the light results from performing optical spectroscopy.

18. The method as in claim 16, wherein detecting comprises determining a frequency of light emitted from the light source by creating an interference pattern between the emitted light and light of a known frequency.

19. The method as in claim 16, wherein the method is implemented by a computer program product stored on machine readable media.

20. The apparatus as in claim 1, further comprising at least one of a housing configured to support the pressure tuned light source, a body configured to contain the pressure tuned light source immersed in a fluid, a piston configured to exert a force upon a fluid to exert a hydrostatic pressure upon the pressure tuned light source, and a fluid configured to exert a hydrostatic pressure upon the pressure tuned light source.

21. The method as in claim 16, further comprising measuring a frequency of the light.

22. The method as in claim 16, further comprising measuring a shift in frequency of the light.

23. A method for performing a measurement in a borehole, the method comprising:
   exposing a pressure tuned light source disposed into the borehole to a hydrostatic pressure;
   detecting light from the pressure tuned light source wherein the light comprises information related to the measurement;
   compensating for temperature in the borehole by using another pressure tuned light source at substantially the same temperature as the pressure tuned light source
   creating a beat frequency from interference between output from the pressure tuned light source and output from the another pressure tuned light source
   performing the measurement with the pressure tuned light source and
   measuring a change in the beat frequency to obtain the temperature compensated measurement.

* * * * *